(12) United States Patent
Singh et al.

(10) Patent No.: US 11,335,690 B2
(45) Date of Patent: May 17, 2022

(54) MULTICOLOR APPROACH TO DRAM STI ACTIVE CUT PATTERNING

(71) Applicant: Applied Materials, Inc., Santa Clara, CA (US)

(72) Inventors: Tejinder Singh, San Jose, CA (US); Takehito Koshizawa, San Jose, CA (US); Abhijit Basu Mallick, Palo Alto, CA (US); Pramit Manna, Sunnyvale, CA (US); Nancy Fung, Livermore, CA (US); Eswaranand Venkatasubramanian, Santa Clara, CA (US); Ho-yung David Hwang, Cupertino, CA (US); Samuel E. Gottheim, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/147,001

(22) Filed: Jan. 12, 2021

(65) Prior Publication Data

US 2021/0134807 A1 May 6, 2021

Related U.S. Application Data

(62) Division of application No. 16/527,915, filed on Jul. 31, 2019, now Pat. No. 10,910,381.

(60) Provisional application No. 62/731,273, filed on Sep. 14, 2018, provisional application No. 62/713,513, filed on Aug. 1, 2018.

(51) Int. Cl.
*H01L 27/10* (2006.01)
*H01L 21/02* (2006.01)
*H01L 27/108* (2006.01)

(52) U.S. Cl.
CPC .................. *H01L 27/10844* (2013.01)

(58) Field of Classification Search
CPC ..... H01L 27/108; H01L 21/02; H01L 21/762; H01L 21/677; H01L 21/67
USPC .......................................... 438/424
See application file for complete search history.

(56) References Cited

U.S. PATENT DOCUMENTS

| | | | | |
|---|---|---|---|---|
| 2011/0215396 A1* | 9/2011 | Tang | ............... | H01L 27/2472 257/E21.409 |
| 2013/0059440 A1* | 3/2013 | Wang | ............... | H01L 21/32137 438/694 |
| 2013/0244430 A1* | 9/2013 | Lin | ............... | H01L 29/49 438/692 |
| 2014/0017889 A1* | 1/2014 | Lee | ............... | H01L 21/4846 438/674 |

(Continued)

FOREIGN PATENT DOCUMENTS

WO 2018118085 A1 6/2018

OTHER PUBLICATIONS

PCT International Search Report and Written Opinion in PCT/US2019/044618 dated Nov. 18, 2019, 12 pages.

*Primary Examiner* — Sheikh Maruf
(74) *Attorney, Agent, or Firm* — Servilla Whitney LLC

(57) ABSTRACT

Apparatuses and methods to provide a patterned substrate are described. A plurality of patterned and spaced first lines and carbon material lines and formed on the substrate surface by selectively depositing and etching films extending in a first direction and films extending in a second direction that crosses the first direction to pattern the underlying structures.

10 Claims, 16 Drawing Sheets

(56) References Cited

U.S. PATENT DOCUMENTS

| | | | |
|---|---|---|---|
| 2014/0048804 A1* | 2/2014 | Cheng | H01L 21/32139 257/E29.003 |
| 2014/0054534 A1* | 2/2014 | Pellizzer | H01L 21/76816 257/E21.585 |
| 2014/0131883 A1* | 5/2014 | Huang | H01L 23/53238 438/643 |
| 2015/0126042 A1* | 5/2015 | Pasquale | C23C 16/401 438/761 |
| 2015/0318181 A1* | 11/2015 | Cantone | H01L 21/823431 438/702 |
| 2016/0218012 A1 | 7/2016 | Shimamoto et al. | |
| 2016/0225633 A1* | 8/2016 | Kim | H01L 21/823431 |
| 2016/0307767 A1* | 10/2016 | Lee | H01L 29/66795 |
| 2016/0307803 A1* | 10/2016 | Mun | H01L 21/3086 |
| 2017/0372960 A1 | 12/2017 | Mebarki et al. | |
| 2019/0006369 A1* | 1/2019 | Chang | H01L 27/10876 |

* cited by examiner

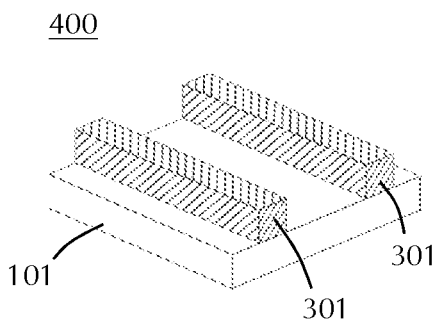 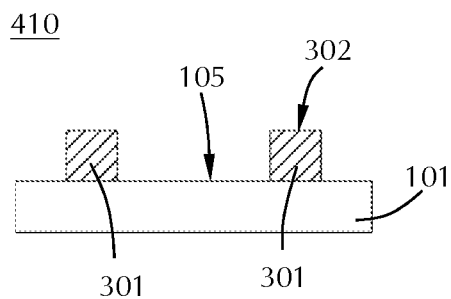
FIG. 4A  FIG. 4B
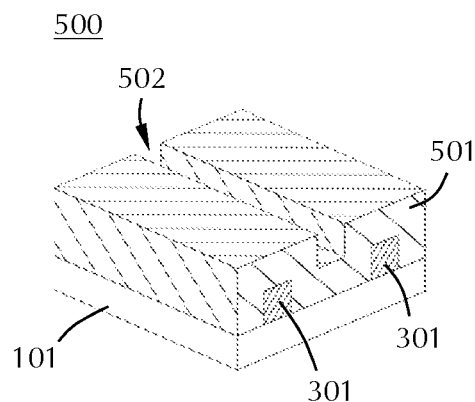 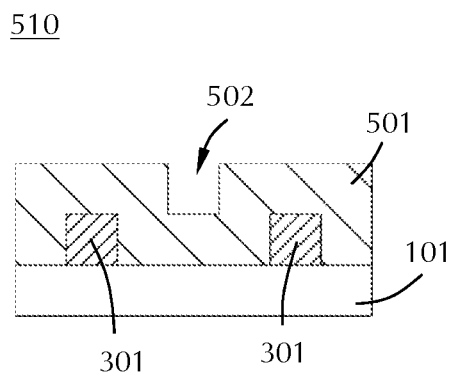
FIG. 5A  FIG. 5B
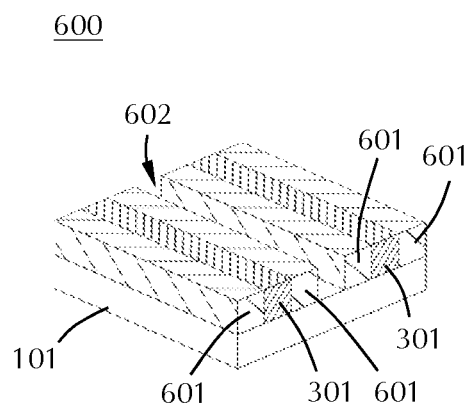 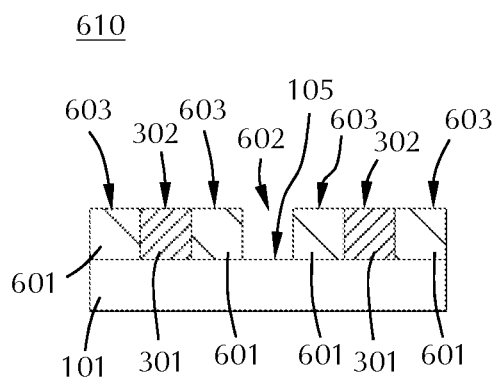
FIG. 6A  FIG. 6B

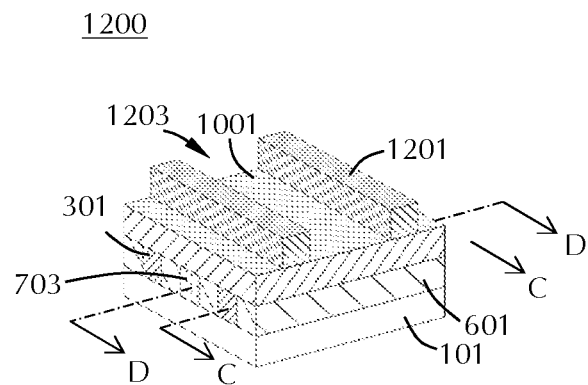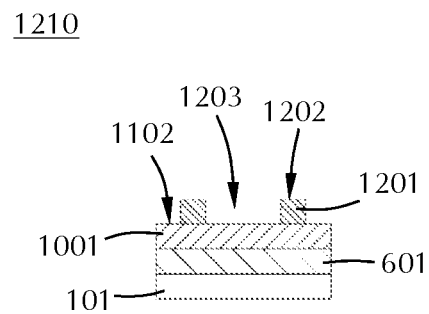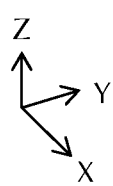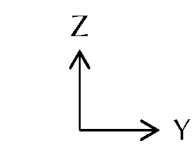
FIG. 12A
FIG. 12B
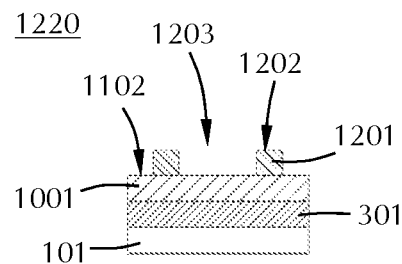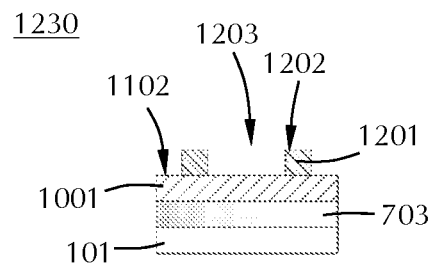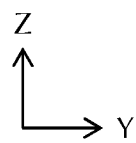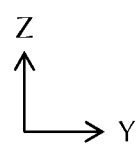
FIG. 12C
FIG. 12D

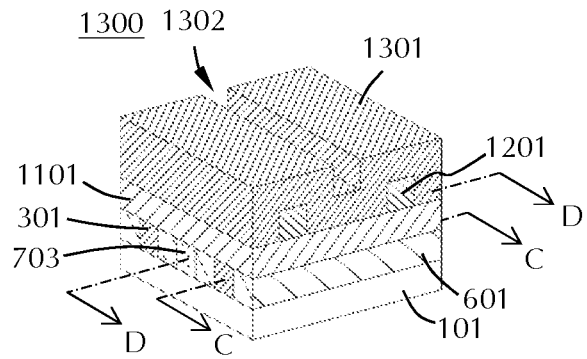
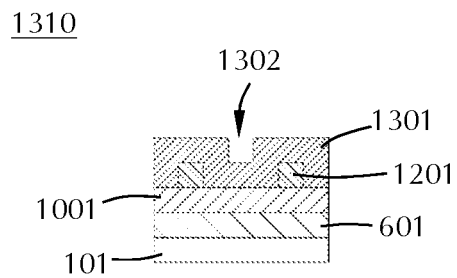
FIG. 13A
FIG. 13B
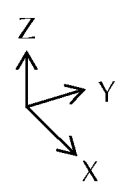
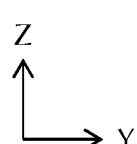
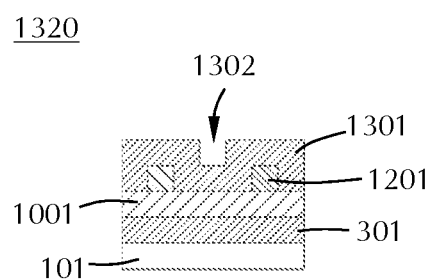
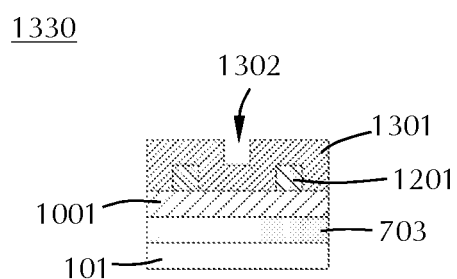
FIG. 13C
FIG. 13D
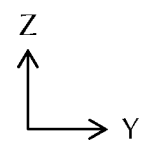
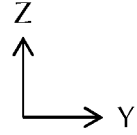

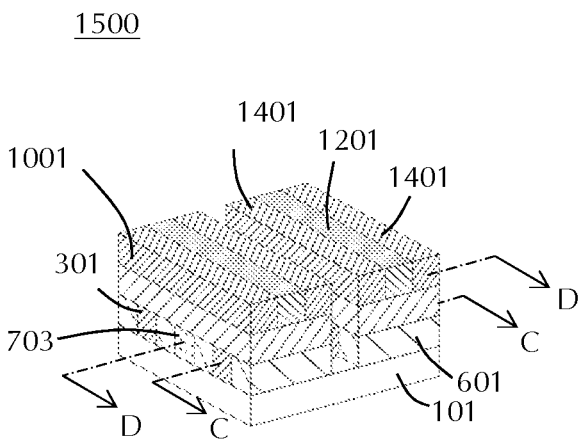
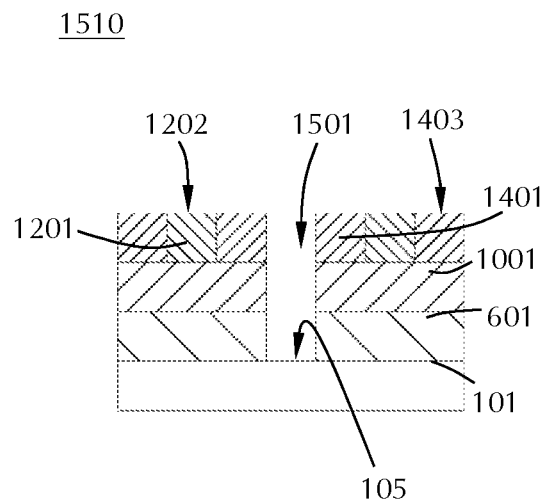
FIG. 15A
FIG. 15B
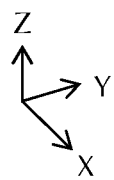
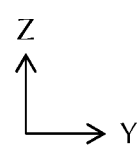
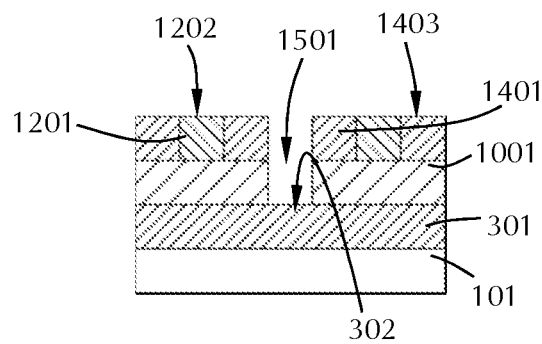
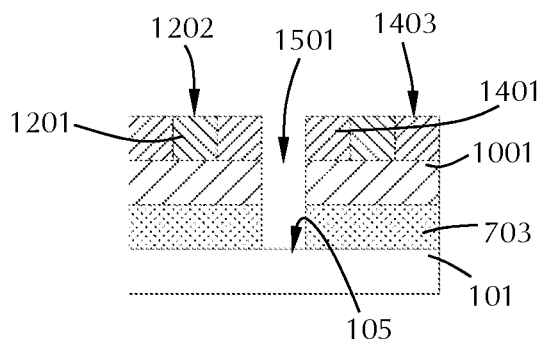
FIG. 15C
FIG. 15D
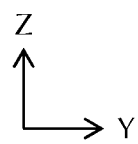
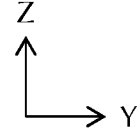

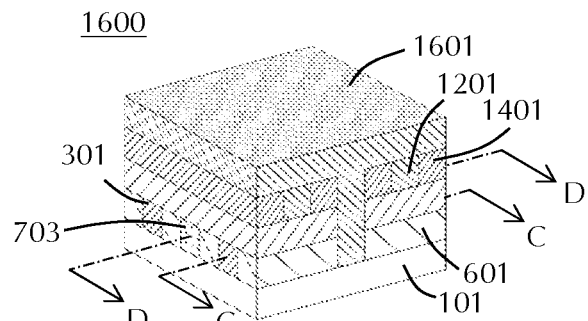
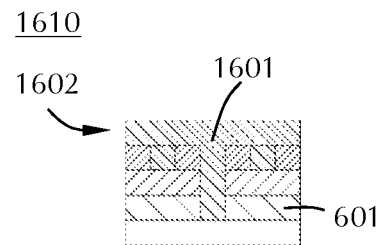
FIG. 16A  FIG. 16B
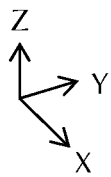
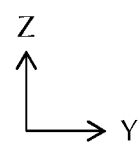
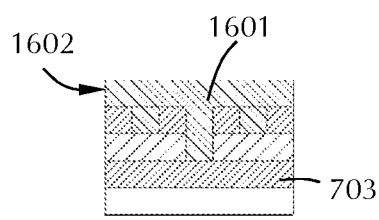
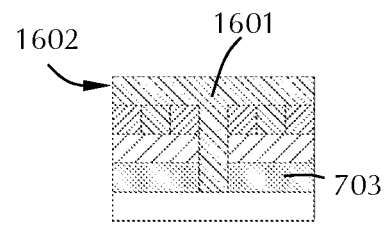
FIG. 16C  FIG. 16D
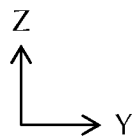
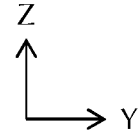

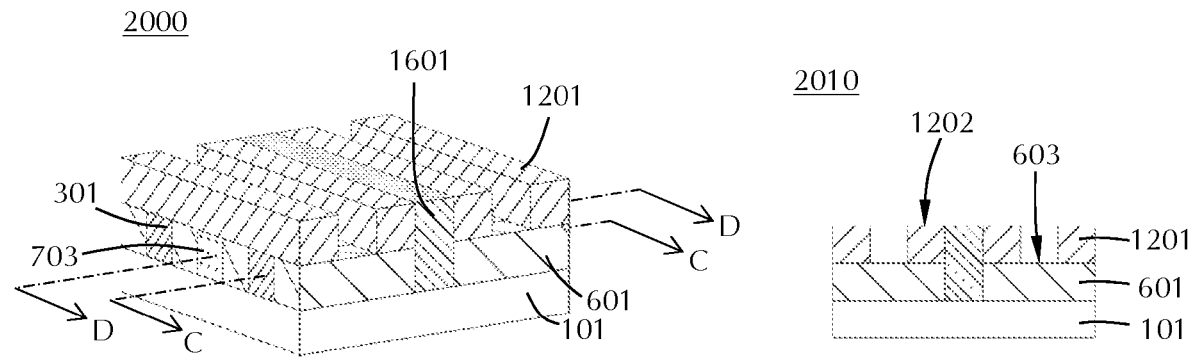
FIG. 20A
FIG. 20B
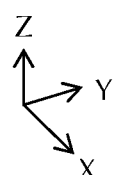
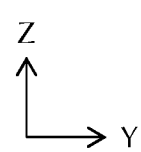
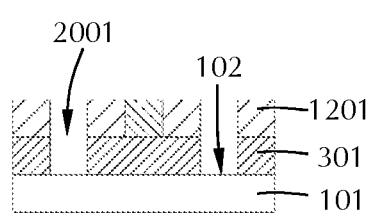
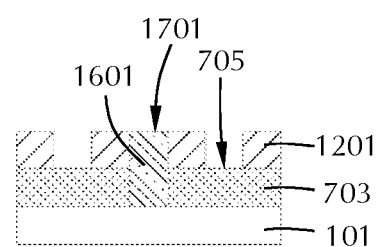
FIG. 20C
FIG. 20D
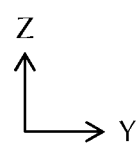

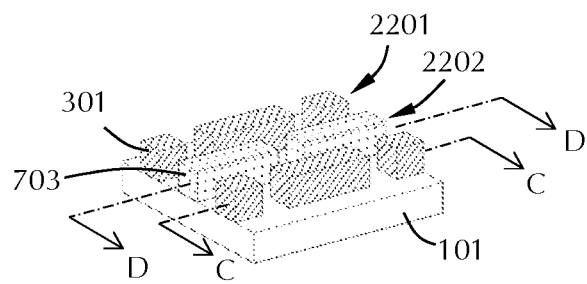
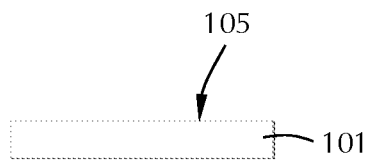
FIG. 22A
FIG. 22B
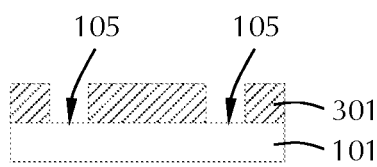
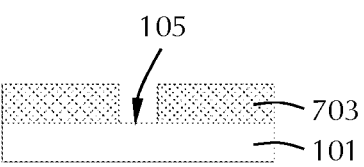
FIG. 22C
FIG. 22D

MULTICOLOR APPROACH TO DRAM STI ACTIVE CUT PATTERNING

CROSS-REFERENCE TO RELATED APPLICATIONS

This application is a divisional of U.S. application Ser. No. 16/527,915, filed on Jul. 31, 2019, which claims priority to U.S. Provisional Application No. 62/713,513, filed Aug. 1, 2018, and U.S. Provisional Application No. 62/731,273, filed Sep. 14, 2018 the entire disclosures of which are hereby incorporated by reference herein.

TECHNICAL FIELD

Embodiments of the present disclosure pertain to the field of electronic device manufacturing, and in particular, to three-dimensional (3D) memory structures. More particularly, embodiments of the disclosure are directed to methods for active cut self-aligned quadruple patterning (SAQP) applications.

BACKGROUND

Generally, an integrated circuit (IC) refers to a set of electronic devices, e.g., transistors formed on a small chip of semiconductor material, typically, silicon. Typically, the IC includes one or more layers of metallization having metal lines to connect the electronic devices of the IC to one another and to external connections. Typically, layers of the interlayer dielectric material are placed between the metallization layers of the IC for insulation.

For current dynamic random access memory (DRAM) active-cut patterning (D1x, D1y node), cross self-aligned double patterning (X-SADP) or lithography-etch-lithography-etch (LELE) schemes are employed. However, integration of these schemes causes shallow trench isolation (STI) active island area (also called Active Area) to be reduced as the technology node advances. If the Active Area shrinks, it can cause buried wordline patterning and yield issues. Therefore, there is an ongoing need in the art for methods of improving active cut areas.

SUMMARY

One or more embodiments of the disclosure are directed to methods of forming an electronic device. A substrate is provided for processing. The substrate comprises: a plurality of first lines extending along a first direction, the first lines comprising a first spacer material, a plurality of second lines comprising a second spacer material extending along the first direction, the second lines arranged on either side of the plurality of first lines and having a trench between adjacent second lines exposing a portion of the substrate. A conformal gapfill process is performed to fill the trench with carbon gapfill material to form a carbon line along the first direction and deposit an overburden carbon material having an opening aligned with the carbon gapfill material in the filled trench. A spin-on-carbon (SOC) layer is deposited on the carbon material to fill the opening in the overburden carbon material and cover the carbon gapfill material in the filled trench and the overburden carbon material. The SOC layer and the overburden carbon material are removed to expose a top surface of the first spacer material, the second spacer material and the carbon gapfill material.

Additional embodiments of the disclosure are directed to methods of forming an electronic device. A substrate comprising a plurality of first lines extending along a first direction, a plurality of carbon material lines extending along the first direction, each of the carbon material lines separated from adjacent first lines by a second line, an oxide layer on the first lines, second lines and carbon material lines, and a plurality of third lines on the oxide layer, the third lines extending along a second direction different than the first direction and spaced to form trenches between adjacent third lines is provided. A conformal gapfill process is performed to fill the trench between adjacent third lines with a fourth spacer material. Portions of the fourth spacer material are removed to provide a plurality of fourth lines of the fourth spacer material. Each of the fourth lines is adjacent to a third line so that each third line has a fourth line on either side thereof, and form an opening exposing the oxide layer. A first cut etch process is performed to remove the oxide layer and portions of the first lines and carbon material lines under the oxide layer, leaving the second lines.

Further embodiments of the disclosure are directed to processing tools for forming a semiconductor device. The processing tools comprise a central transfer station with a plurality of processing chambers disposed around the central transfer station. A robot is within the central transfer station and is configured to move a substrate between the plurality of processing chambers. A first processing chamber is connected to the central transfer station. The first processing chamber is configured to perform etch process. A second processing chamber is connected to the central transfer station. The second processing chamber is configured to perform deposition processes. A controller is connected to one or more of the central transfer station, the robot, the first processing chamber, and/or the second processing chamber. The controller has one or more configurations selected from a first configuration to move a substrate on the robot between the plurality of processing chambers, a second configuration to perform a conformal gapfill process in one or more of the processing chambers, a third configuration to perform one or more etch processes, a fourth configuration to perform a chemical-mechanical planarization process, and a fifth configuration to perform a lithography process.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

FIG. 4A is a view similar to FIG. 3A after a mandrel pull-out process according to one embodiment;

FIG. 4B illustrates a front view of the electronic device structure depicted in FIG. 4A;

FIG. 5A is a view similar to FIG. 4A after spacer on spacer deposition process according to one embodiment;

FIG. 5B illustrates a front view of the electronic device structure depicted in FIG. 5A;

FIG. 6A is a view similar to FIG. 5A after a second spacer etch process according to one embodiment;

FIG. 6B illustrates a front view of the electronic device structure depicted in FIG. 6A;

FIG. 12A is a view similar to FIG. 11A rotated 90° after formation of third lines according to one embodiment;

FIG. 12B illustrates a front slice of the electronic device structure depicted in FIG. 12A;

FIG. 12C illustrates a slice of the electronic device structure depicted in FIG. 12A taken in the y-z plane along line C-C;

FIG. 12D illustrates a slice of the electronic device structure depicted in FIG. 12A taken in the y-z plane along the line D-D;

FIG. 13A is a view similar to FIG. 12A after conformal spacer deposition according to one embodiment;

FIG. 13B illustrates a front slice of the electronic device structure depicted in FIG. 13A;

FIG. 13C illustrates a slice of the electronic device structure depicted in FIG. 13A taken in the y-z plane along line C-C;

FIG. 13D illustrates a slice of the electronic device structure depicted in FIG. 13A taken in the y-z plane along the line D-D;

FIG. 15A is a view similar to FIG. 14A after a first cut process according to one embodiment;

FIG. 15B illustrates a front slice of the electronic device structure depicted in FIG. 15A;

FIG. 15C illustrates a slice of the electronic device structure depicted in FIG. 15A taken in the y-z plane along line C-C;

FIG. 15D illustrates a slice of the electronic device structure depicted in FIG. 15A taken in the y-z plane along the line D-D;

FIG. 16A is a view similar to FIG. 15A after a spin-on material deposition according to one embodiment;

FIG. 16B illustrates a front slice of the electronic device structure depicted in FIG. 16A;

FIG. 16C illustrates a slice of the electronic device structure depicted in FIG. 16A taken in the y-z plane along line C-C;

FIG. 16D illustrates a slice of the electronic device structure depicted in FIG. 16A taken in the y-z plane along the line D-D;

FIG. 20A is a view similar to FIG. 19A after an etchback process to remove the fourth lines according to one embodiment;

FIG. 20B illustrates a front slice of the electronic device structure depicted in FIG. 20A;

FIG. 20C illustrates a slice of the electronic device structure depicted in FIG. 20A taken in the y-z plane along line C-C;

FIG. 20D illustrates a slice of the electronic device structure depicted in FIG. 20A taken in the y-z plane along the line D-D;

FIG. 22A is a view similar to FIG. 21A after an oxide removal process to form patterned lines on the substrate according to one embodiment;

FIG. 22B illustrates a front slice of the electronic device structure depicted in FIG. 22A;

FIG. 22C illustrates a slice of the electronic device structure depicted in FIG. 22A taken in the y-z plane along line C-C;

FIG. 22D illustrates a slice of the electronic device structure depicted in FIG. 22A taken in the y-z plane along the line D-D.

DETAILED DESCRIPTION

Figure 1A:
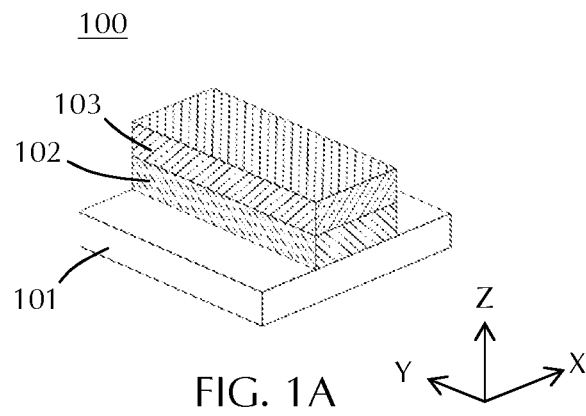
FIG. 1A illustrates an isotropic view of an electronic device structure according to one embodiment.

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

One or more embodiments of the disclosure are directed to integration schemes for DRAM shallow trench isolation (STI) active-cut that uses a multi-color approach. As used in this manner, the term "multi-color" refers to multiple films that are etch selective to each other. Some embodiments of the disclosure advantageously provide improved shallow trench isolation area (Active Area) by ~25%. Some embodiments advantageously provide methods with increased margin for buried wordline patterning. One or more embodiments of the disclosure provide new gapfill materials (carbon based) for active area patterning and a novel self-aligned double patterning process using multi-color approach to achieve high active area.

Some embodiments of the disclosure are directed to integration schemes that use self-aligned quadruple patterning (SAQP) for active area patterning using gapfill materials and cross self-aligned double patterning (X-SADP) using a multi-color approach. SAQP with gapfill approach benefits from 1:1 selectivity to spin-on materials. This can be achieved by, for example, $H_2/N_2$ plasma. Some embodiments, for example, for X-SADP use a multi-color approach where Material A is selective to Material B and Material C. Some embodiments of the disclosure provide a spacer-on-spacer scheme for active area patterning that reduces the number of patterning steps and cost. Some embodiments provide spacer-on-spacer schemes for active cut patterning that reduces the number of patterning steps and cost. Some embodiments of the disclosure increase the Active Area by greater than or equal to about 10%, 15%, 20% or 25%.

In some embodiments, the multi-color film is selected from one or more of high sp3 carbon (C), spin-on-carbon (SOC), silicon boride (SiB), physical vapor deposition (PVD) silicon nitride (SiN), low temperature oxide (LTO). In some embodiments, one or more of the multicolor films have an etch selectivity of >10:1 relative to other films present.

In the following description, numerous specific details, such as specific materials, chemistries, dimensions of the elements, etc. are set forth in order to provide thorough understanding of one or more of the embodiments of the present disclosure. It will be apparent, however, to one of ordinary skill in the art that the one or more embodiments of the present disclosure may be practiced without these specific details. In other instances, semiconductor fabrication processes, techniques, materials, equipment, etc., have not been described in great details to avoid unnecessarily obscuring of this description. Those of ordinary skill in the art, with the included description, will be able to implement appropriate functionality without undue experimentation.

While certain exemplary embodiments of the disclosure are described and shown in the accompanying drawings, it is to be understood that such embodiments are merely illustrative and not restrictive of the current disclosure, and that this disclosure is not restricted to the specific constructions and arrangements shown and described because modifications may occur to those ordinarily skilled in the art.

Reference throughout the specification to "one embodiment", "another embodiment", or "an embodiment" means that a particular feature, structure, or characteristic described in connection with the embodiment is included in a least one embodiment of the present disclosure. Thus, the appearance of the phrases "in one embodiment" or "in an embodiment" in various places throughout the specification are not necessarily all referring to the same embodiment of the disclosure. Furthermore, the particular features, structures, or characteristics may be combined in any suitable manner in one or more embodiments.

Referring to FIGS. 1A through 22D illustrate a process in accordance with one or more embodiment of the disclosure. The skilled artisan will recognize that the embodiment illustrated is merely exemplary of one possible method and that variation and modifications are within the scope of the disclosure. Additionally, the skilled artisan will recognize that the method can begin with any of the illustrated electronic devices. For example, the method may begin with the electronic device depicted in FIGS. 6A and 6B where a device similar to the described embodiment is provided for further processing.

The illustrations presented in FIGS. 1A through 11B illustrate an active area portion of the method in accordance with one or more embodiment of the disclosure. In each of these Figures, the 'A' figure (e.g., FIG. 1A) provide an isometric view of an electronic device structure and the 'B' figure (e.g., FIG. 1B) provides a view of a front view of the electronic device structure of the respective 'A' figure taken along the x-z plane, with the y-axis extending normal to the page of the illustrations. The coordinate axes for FIGS. 1A through 11B are only shown in FIGS. 1A and 1B; however, the skilled artisan will recognize that the coordinate axes for each of the 'A' figures and 'B' figures of FIGS. 2A through 11B are shown in FIGS. 1A and 1B, respectively.

Figure 1B:
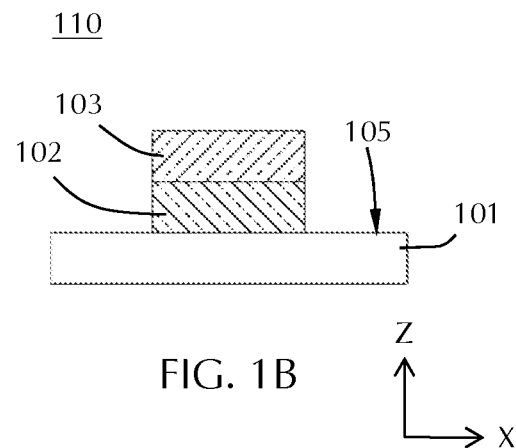
FIG. 1B illustrates a front view of the electronic device structure depicted in FIG. 1A.

FIG. 1A illustrates an isometric view 100 of an electronic device structure according to one embodiment. FIG. 1B is a front view 110 of the electronic device depicted in FIG. 1A. A substrate 101 has a spacer material 102 with an anti-reflective coating (ARC) 103 thereon. In an embodiment, the substrate 101 comprises a semiconductor material, e.g., silicon (Si), carbon (C), germanium (Ge), silicon germanium (SiGe), gallium arsenide (GaAs), indium phosphide (InP), indium gallium arsenide (InGaAs), aluminum indium arsenide (InAlAs), other semiconductor material, or any combination thereof. In an embodiment, substrate 101 is a semiconductor-on-isolator (SOI) substrate including a bulk lower substrate, a middle insulation layer, and a top monocrystalline layer. The top monocrystalline layer may comprise any material listed above, e.g., silicon. In various embodiments, the substrate 101 can be, e.g., an organic, a ceramic, a glass, or a semiconductor substrate. Although a few examples of materials from which the substrate 101 may be formed are described here, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

The spacer material 102 of some embodiments comprises spin-on-carbon (SOC). The anti-reflective coating 103 of some embodiments comprises a silicon ARC. The width of the spacer material 102 and the ARC 103 can be any suitable width depending on the target width of the final structures and multi-patterning operations have been performed.

The spacer material 102 and ARC 103 can be formed by any suitable process known to the skilled artisan. In an embodiment, spacer material 102 and/or ARC 103 is/are deposited independently using one of deposition techniques, such as but not limited to a chemical vapor deposition ("CVD"), a physical vapor deposition ("PVD"), molecular beam epitaxy ("MBE"), metalorganic chemical vapor deposition ("MOCVD"), atomic layer deposition ("ALD"), spin-on, or other insulating deposition techniques known to one of ordinary skill in the art of microelectronic device manufacturing.

Figure 2A:
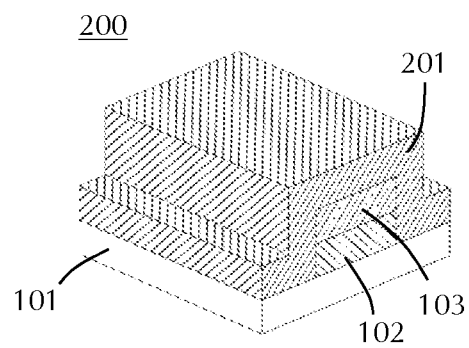
FIG. 2A is a view similar to FIG. 1A, after a conformal spacer deposition process according to one embodiment.
Figure 2B:
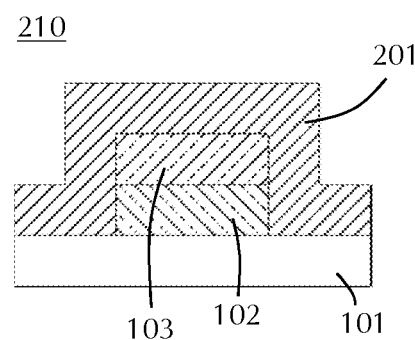
FIG. 2B illustrates a front view of the electronic device structure depicted in FIG. 2A.

FIG. 2A is a view 200 similar to isometric view 100 of FIG. 1A, after conformal deposition of a first spacer material 201 on the stack of spacer material 102 and ARC 103 according to one embodiment. FIG. 2B is a front view 210 of the electronic device depicted in FIG. 2A.

The first spacer material 201 of some embodiments comprises a boride film. In some embodiments, the first spacer material 201 comprises or consists essentially of or consists of silicon boride. As used in this manner, the term "consists essentially of" means that the specified film or material is greater than or equal to about 95%, 98%, 99% or 99.5% of the stated material.

The first spacer material 201 can be deposited by any suitable conformal deposition technique known to the skilled artisan. For example, the first spacer material 201 can be deposited by ALD or CVD processes.

Figure 3A:
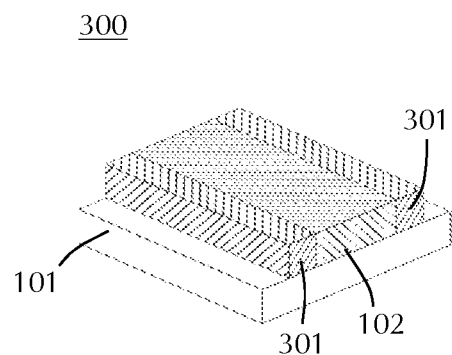
FIG. 3A is a view similar to FIG. 2A after a spacer etch process according to one embodiment.
Figure 3B:
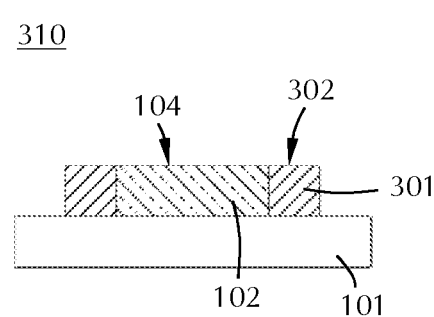
FIG. 3B illustrates a front view of the electronic device structure depicted in FIG. 3A.

FIG. 3A is a view 300 similar to isometric view 200 of FIG. 2A, after etching of first spacer material 201 and ARC 103 according to one embodiment. FIG. 3B is a front view 310 of the electronic device depicted in FIG. 3A. Removal of portions of the first spacer material 201 and ARC 103 results in the formation of a plurality of first lines 301 comprising the first spacer material. The first lines 301 extend in a first direction. The Figures illustrate the first direction as along the extending along the Y-axis. The top surface 302 of the first lines 301 and the top surface 104 of the ARC 103 are exposed by the removal process. The first spacer material 201 and ARC 103 can be removed by any suitable process known to the skilled artisan. In some embodiments, the first spacer material 201 and ARC 103 are removed by a selective etch process in which the etchant selectively removes the top of the first spacer material 201 and ARC 103 in a controlled manner to leave the first lines 301 of the first material.

FIG. 4A is a view 400 similar to isometric view 300 of FIG. 3A, after removal of the spacer material 102 according to one embodiment. FIG. 4B is a front view 410 of the electronic device depicted in FIG. 4A. The process illustrated in FIGS. 4A and 4B may be referred to as a mandrel pull out process. Removal of the spacer material 102 leaves a top surface 105 of the substrate 101 exposed between the first lines 301.

The spacer material 102 can be removed by any suitable process including, but not limited to, selective etch or ash processes in which the process selectively removes the spacer 102 relative to the first lines 301. In some embodiments, the spacer material 102 comprises spin-on-carbon and the first lines 301 comprise silicon boride and the etchant is selective for the spin-on-carbon leaving the first lines of silicon boride.

FIG. 5A is a view 500 similar to isometric view 400 of FIG. 4A, after a spacer material 501 is conformally deposited on the first lines 301 according to one or more embodiment. FIG. 5B is a front view 510 of the electronic device depicted in FIG. 5A. This process may also be referred to as spacer-on-spacer deposition. The second spacer material 501 can be any suitable composition including, but not limited to, a low temperature oxide film. In some embodiments, the second spacer material 501 is deposited by one or more of an ALD or CVD process.

FIG. 6A is a view 600 similar to isometric view 500 of FIG. 5A, after performing a second spacer etch according to one or more embodiment. FIG. 6B is a front view 610 of the electronic device depicted in FIG. 6A. The second spacer material 501 is etched to remove the second spacer material 501 from the top surface 302 of the first lines 301 and from the substrate 101 to expose a portion of the substrate surface 105. The second spacer etch forms a plurality of second lines 601 of a second spacer material that extend along the first direction. The second lines 601 are arranged on either side of the each of the first lines 301 and adjacent second lines 601 are spaced to form a trench 602 between lines in which the substrate surface 105 is exposed.

Figure 7A:
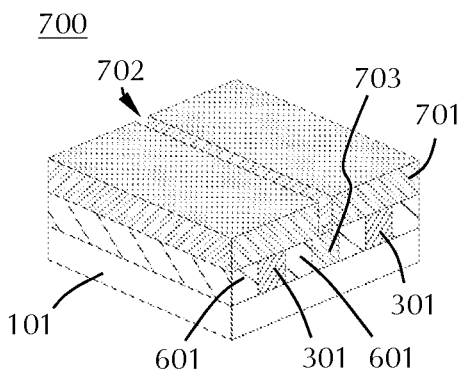
FIG. 7A is a view similar to FIG. 6A after a gapfill process according to one embodiment.
Figure 7B:
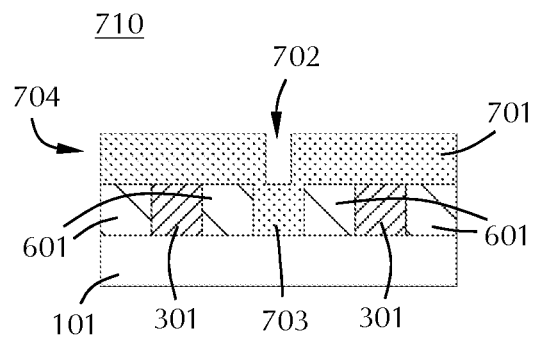
FIG. 7B illustrates a front view of the electronic device structure depicted in FIG. 7A.

FIG. 7A is a view 700 similar to isometric view 600 of FIG. 6A, after performing a gapfill process according to one or more embodiment. FIG. 7B is a front view 710 of the electronic device of FIG. 7A. The gapfill process deposits a carbon material 701 that can fill the trench 602 with carbon gapfill material 703 to form a carbon line that extends along the first direction between the adjacent second lines 601. An overburden carbon material 704 can be formed on the top surfaces of the first lines 301 and second lines 601. In some embodiments, the gapfill process fills the trench 602 and forms an overburden material 703.

The gapfill process can be a conformal gapfill process, a bottom-up gap fill process or a non-conformal gapfill process. In some embodiments, the gap fill process uses a flowable film to fill the trench 602. In the illustrated embodiment, the gapfill process forms the carbon gapfill material 703 and overburden carbon material 704 in a conformal process that results in the formation of an opening 702 in the carbon material 701. The opening 702 in the carbon material 701 is aligned with the trench 602 that has been filled with carbon gapfill material 703. The opening 702 in the overburden carbon material 704 can be the same width as the trench 602 or can be narrower, as illustrated.

The carbon material 701 of some embodiments is a diamond-like carbon material. For diamond-like carbon materials, the bulk properties sought in the gapfill may include, without limitation, high density and modulus (e.g., higher sp3 content, more diamond-like) and low stress (e.g., <−500 MPa). Some embodiments of diamond-like carbon films have one or more of high density (e.g., >1.8 g/cc), high modulus (e.g., >150 GPa) and/or low stress (e.g., <−500 MPa). The carbon material 701 according to some embodiments has a low stress and high sp3 carbon content.

In some embodiments, the carbon material 701 described herein may be formed by chemical vapor deposition (plasma enhanced and/or thermal) processes using a gapfill precursor. In some embodiments, the gapfill precursor comprises a hydrocarbon and the gapfill comprises a diamond-like carbon material. In some embodiments, the hydrocarbon is selected from a group consisting of: $C_2H_2$, $C_3H_6$, $CH_4$, $C_4H_8$, 1,3-dimethyladamantane, bicyclo[2.2.1]hepta-2,5-diene (2,5-Norbornadiene), adamantine ($C_{10}H_{16}$), norbornene ($C_7H_{10}$), or combinations thereof.

The deposition of the carbon material 701 may be carried out at temperatures ranging from −50 degrees Celsius to 600 degrees Celsius. The deposition process may be carried out in a processing volume at pressures ranging from 0.1 mTorr to 10 Torr. The gapfill precursor may further include any one of, or a combination of any of He, Ar, Xe, $N_2$, $H_2$.

In some embodiments, the carbon material 701 precursor may further comprise etchant gases such as $Cl_2$, $CF_4$, $NF_3$ to improve film quality. The plasma (e.g., capacitive-coupled plasma) may be formed from either top and bottom electrodes or side electrodes. The electrodes may be formed from a single powered electrode, dual powered electrodes, or more electrodes with multiple frequencies such as, but not limited to, 350 kHz, 2 MHz, 13.56 MHz, 27 MHz, 40 MHz, 60 MHz and 100 MHz, being used alternatively or simultaneously in a CVD system with any or all of the reactant gases listed herein to deposit a gapfill material in a feature of a substrate.

In some embodiments, hydrogen radicals are fed through a remote plasma source (RPS) during carbon material 701 deposition. The RPS hydrogen radicals can selectively etch sp2 hybridized carbon atoms, increasing the sp3 hybridized carbon atom fraction of the carbon material 701.

Figure 8A:
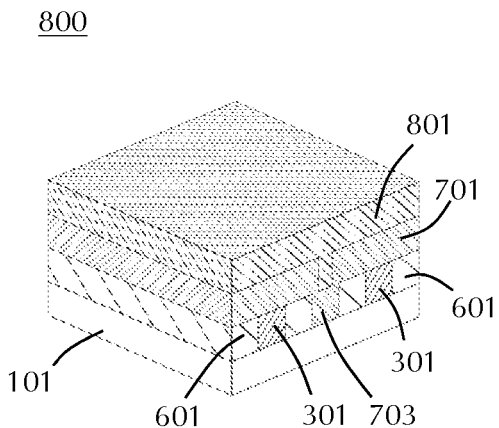
FIG. 8A is a view similar to FIG. 7A after a spin-on material deposition process according to one embodiment.
Figure 8B:
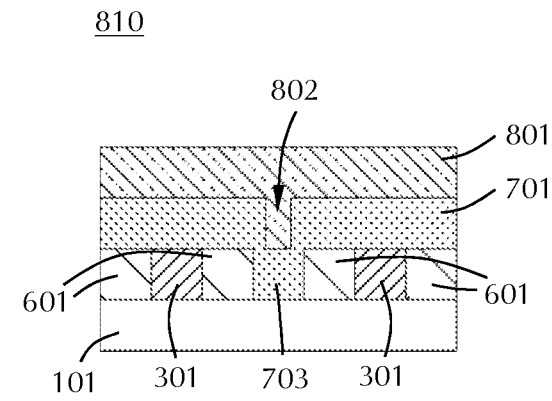
FIG. 8B illustrates a front view of the electronic device structure depicted in FIG. 8A.

FIG. 8A is a view 800 similar to isometric view 700 of FIG. 7A, after depositing a spin-on-carbon (SOC) layer 801 on the carbon material 701 according to one or more embodiment. FIG. 8B is a front view 810 of the electronic device of FIG. 8A. The SOC layer 801 can be deposited by any suitable technique known to the skilled artisan, including, but not limited to, bulk deposition, conformal deposition, flowable film deposition. The SOC layer 801 fills the opening 702 with carbon material 802 and covers the carbon material in the filled trench and the overburden carbon material.

Figure 9A:
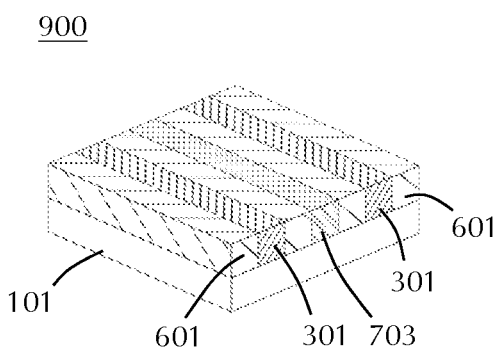
FIG. 9A is a view similar to FIG. 8A after an etchback process according to one embodiment.
Figure 9B:
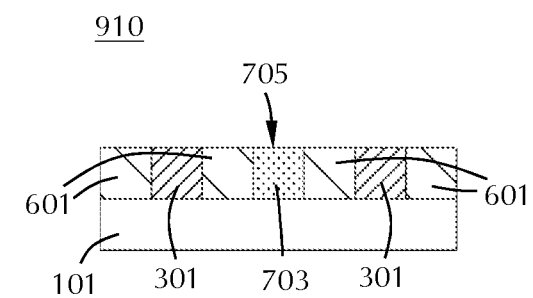
FIG. 9B illustrates a front view of the electronic device structure depicted in FIG. 9A.

FIG. 9A is a view 900 similar to isometric view 800 of FIG. 8A, after removal of the overburden carbon material and the SOC layer 801 according to one or more embodiment. FIG. 9B is a front view 910 of the electronic device of FIG. 9A. The SOC layer 801 and the overburden carbon material 701 can be removed by any suitable technique. In some embodiments, the SOC layer 801 and the overburden carbon material 701 are removed by an etch process that is 1:1 selective. As used in this manner, the term "1:1 selective" means that the etch process removes substantially equal amounts of the SOC layer 801 and the overburden carbon material 701 per unit time. As used in this manner, "substantially equal amounts" means that for any amount (e.g., thickness) of SOC layer 801 removed by the etch process, the amount of the overburden carbon material 701 removed at the same time is the range of about 90% to about 110% of the amount of the SOC layer 801 removed. In some embodiments, the overburden carbon material 701 and SOC layer 801 are etched with an $H_2/N_2$ plasma or by a $CF_4/O_2$ plasma. In some embodiments, the overburden material 701 comprises spin-on-carbon and the selective etch is performed using a plasma mixture of molecular hydrogen ($H_2$) and molecular nitrogen ($N_2$). In some embodiments, the overburden material 701 comprises a silicon anti-reflective coating (SiARC) and the selective etch is performed using a plasma mixture of carbon tetrafluoride ($CF_4$) and molecular oxygen ($O_2$). In some embodiments, the SOC layer 801 and overburden carbon material 701 are removed by a chemical-mechanical planarization (CMP) process. After removal, the substrate 101 has first lines 301, second lines 601 and carbon gapfill material 703 forming a line; all of which extend along the first direction.

Figure 10A:
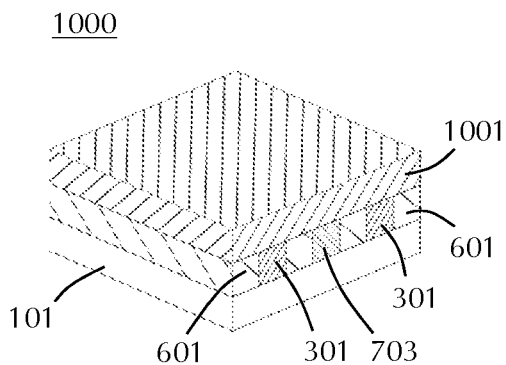
FIG. 10A is a view similar to FIG. 9A after an oxide layer deposition process according to one embodiment.
Figure 10B:
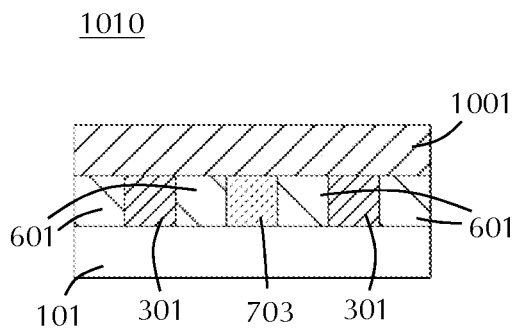
FIG. 10B illustrates a front view of the electronic device structure depicted in FIG. 10A.

FIG. 10A is a view 1000 similar to isometric view 900 of FIG. 9A, after deposition of an oxide layer 1001 according to one or more embodiment. FIG. 10B is a front view 1010 of the electronic device of FIG. 10A. The oxide layer 1001 of some embodiments comprises a silicon oxide film or a dielectric material. The oxide layer 1001 can be deposited by any suitable technique known to the skilled artisan.

Figure 11A:
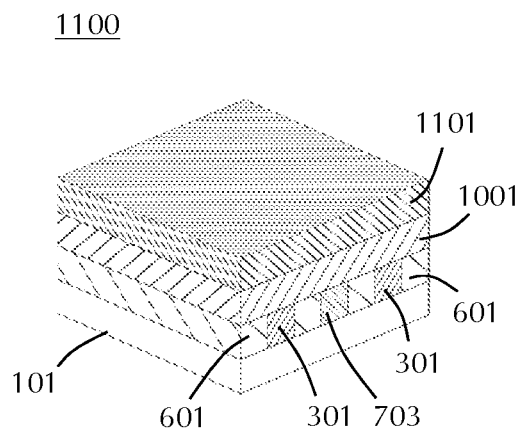
FIG. 11A is a view similar to FIG. 10A after a nitride layer deposition process according to one embodiment.
Figure 11B:
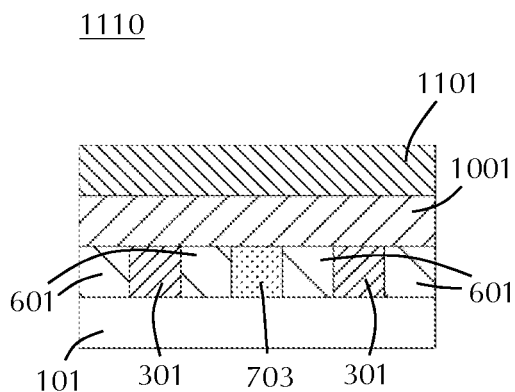
FIG. 11B illustrates a front view of the electronic device structure depicted in FIG. 11A.

FIG. 11A is a view 1100 similar to isometric view 1000 of FIG. 10A, after deposition of a nitride layer 1101 according to one or more embodiment. FIG. 10B is a front view 1110 of the electronic device of FIG. 11A. The nitride layer 1101 of some embodiments comprises a silicon nitride film. The nitride layer 1101 can be deposited by any suitable technique known to the skilled artisan.

The process of FIGS. 1A through 11B continue in FIGS. 12A through 22D. For illustrative purposes, the electronic device structure illustrated in the FIGS. 1A through 11B are turned 90° around the z-axis in FIGS. 12A through 22D. The first direction that the first lines 301, second lines 601 and carbon material lines 703 still extends along the length of the y-axis. For FIGS. 12A through 22D, each of the 'A' figures illustrates an isometric view of the electronic device, each of the 'B' figures illustrates a slice of the electronic device of the corresponding 'A' figure at the front portion of the illustrated isometric view taken along the y-z plane, each of the 'C' figures illustrates a slice of the electronic device of the corresponding 'A' figure taken along the y-z plane along line C-C, and each of the 'D' figures illustrates a slice of the electronic device of the corresponding 'A' figure taken along the y-z plane along line D-D. The slices illustrated in the 'B', 'C' and 'D' figures are not cross-sectional views; the portions of the electronic device behind and in front of the illustrated plane are not shown. The slices illustrated in the 'B' figures show the device taken along the second lines 601. The slices illustrated in the 'C' figures show the device taken along the first line 301. The slices illustrated in the 'D' figures who the device taken along the carbon material lines 703.

FIG. 12A illustrates a view 1200 of an electronic device structure similar to FIG. 11A with the device rotated around the z-axis by 90°. In some embodiments, the method begins with the device illustrated in FIGS. 12A-12D. A substrate similar to that of FIG. 12A can be provided for processing. The substrate of some embodiments comprises a plurality of first lines 301 extending along a first direction, a plurality of carbon material lines 703 extending along the first direction and a plurality of second lines 601 extending along the first direction. Each of the first lines 301 have a second line 601 on either side thereof. The first lines 301 and adjacent carbon material lines 703 are separated by a second line 601. On oxide layer 1001 is on the first lines 301, second lines 601 and carbon material lines 703. A plurality of third lines 1201 extending along a second direction different than the first direction is on the oxide layer 1001. The third lines 1201 are spaced apart to form trenches 1203 between adjacent third lines.

FIG. 13A is a view 1300 similar to isometric view 1200 of FIG. 12A, after performing a spacer deposition process to fill the trench 1203 between adjacent third lines 1201 with a fourth spacer material 1301. FIG. 13B is a view 1310 showing the front of FIG. 13A. FIG. 13C is a view 1320 showing a slice taken in the y-z plane along line C-C of FIG. 13A. FIG. 13D is a view 1330 showing a slice taken in the y-z plane along line D-D of FIG. 13A. The process illustrated is similar to and in a direction perpendicular to that of FIG. 2A.

The spacer deposition process forms a film of a fourth spacer material 1301 that covers the top 1202 of the third lines and the top surface 1102 of the oxide layer 1001. The fourth spacer material 1301 has a gap 1302 formed between the third lines 1201.

The fourth spacer material 1301 can be any suitable spacer material that is etch selective relative to the third spacer material. In some embodiments, the fourth spacer material comprises a boride film. In one or more embodiments, the fourth spacer material 1301 comprises, consists essentially of, or consists of silicon boride.

Figure 14A:
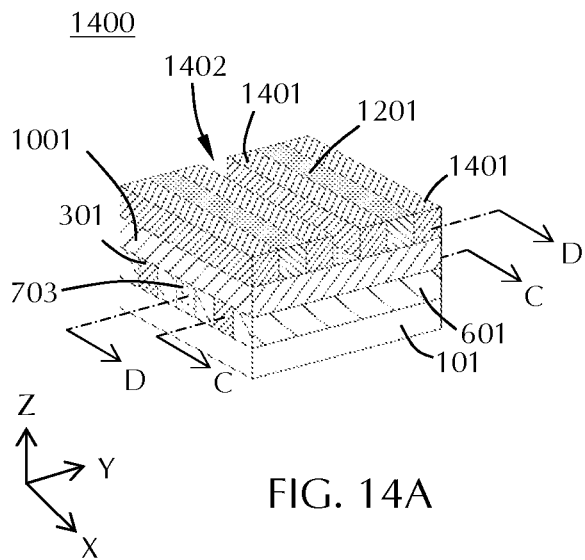
FIG. 14A is a view similar to FIG. 13A after a spacer etch process according to one embodiment.
Figure 14B:
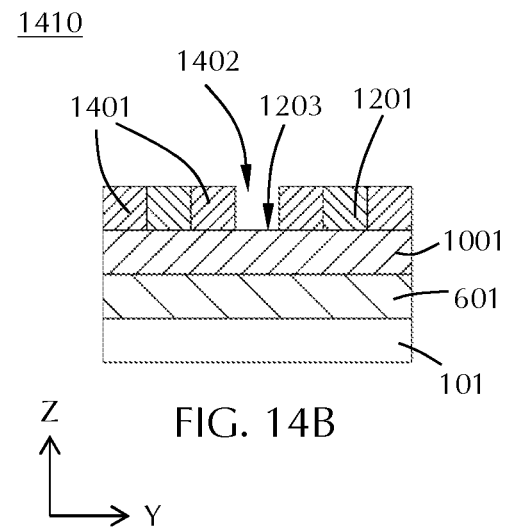
FIG. 14B illustrates a front slice of the electronic device structure depicted in FIG. 14A.
Figure 14C:
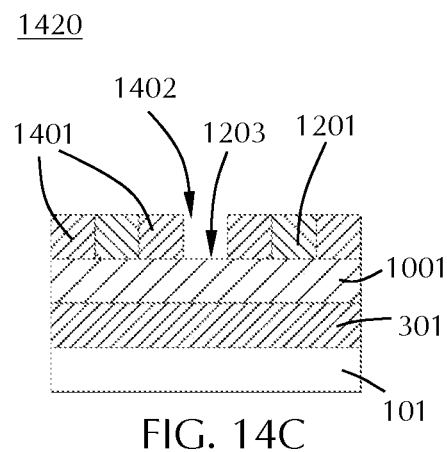
FIG. 14C illustrates a slice of the electronic device structure depicted in FIG. 14A taken in the y-z plane along line C-C.
Figure 14D:
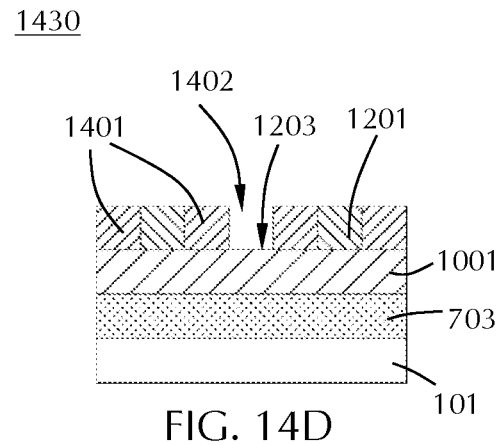
FIG. 14D illustrates a slice of the electronic device structure depicted in FIG. 14A taken in the y-z plane along the line D-D.

FIG. 14A is a view 1400 similar to isometric view 1300 of FIG. 13A, after removing portions of the fourth spacer material 1301 to provide a plurality of fourth lines 1401 of the fourth spacer material. FIG. 14B is a view 1410 showing the front of FIG. 14A. FIG. 14C is a view 1420 showing a slice taken in the y-z plane along line C-C of FIG. 14A. FIG. 14D is a view 1430 showing a slice taken in the y-z plane along line D-D of FIG. 14A. After removal of the portions of the fourth spacer material 1301, a plurality of fourth lines 1401 are formed adjacent to and on either side of each of the plurality of third lines 1201 exposing the top 1202 of the third liner 1201 and leaves an opening 1402 between adjacent fourth lines 1301. Removing the portions of the fourth spacer material 1301 can be done by any suitable process. In some embodiments, removing the portions of the fourth spacer material 1301 is done by an etch process.

FIG. 15A is a view 1500 similar to isometric view 1400 of FIG. 14A, after a first cut etch process according to one or more embodiment. FIG. 15B is a view 1510 showing the front of FIG. 15A. FIG. 15C is a view 1520 showing a slice taken in the y-z plane along the line C-C of FIG. 15A. FIG. 15D is a view 1530 showing a slice taken in the y-z plane along the line D-D of FIG. 15A.

The first cut etch process removes the oxide layer 1001 and portions of the second lines 601 and carbon material lines 703 under the oxide layer 1001 through opening 1402. FIGS. 15B and 15D, respectively, show the removal of the second lines 601 and the carbon material lines 703 exposing the substrate surface 105. This process is etch selective relative to the first lines 301, as shown in FIG. 15C, so that the first lines 301 are substantially unaffected by the etch and the top surface 302 remains. The first cut etch process can be done by any suitable technique known to the skilled artisan.

In some embodiments, the films etched by the first cut etch process comprise one or more of silicon oxide or low temperature oxide. In some embodiments, the films unaffected by the first cut etch process comprise one or more of silicon nitride, (CVD or PVD) or silicon bromide.

FIG. 16A is a view 1600 similar to isometric view 1500 of FIG. 15A, after deposition of a spin-on material 1601 according to one or more embodiment. FIG. 16B is a view 1610 showing the front of FIG. 16A. FIG. 16C is a view 1620 showing a slice taken in the y-z plane along the line C-C of FIG. 16A. FIG. 16D is a view 1630 showing a slice taken in the y-z plane along the line D-D of FIG. 16A.

The spin-on material 1601 fills the opening 1501 formed in the first cut etch process to fill spaces created by removal of the portions of the second lines 601 and carbon material lines 703. In the embodiment illustrated in FIG. 16A-D, the spin-on material 1601 forms an overburden 1602 on top of the third lines 1201 and fourth lines 1401.

The spin-on material 1601 can be any suitable material deposited by any suitable technique known to the skilled artisan. In some embodiments, the spin-on material 1601 comprises a spin-on carbon film.

Figure 17A:
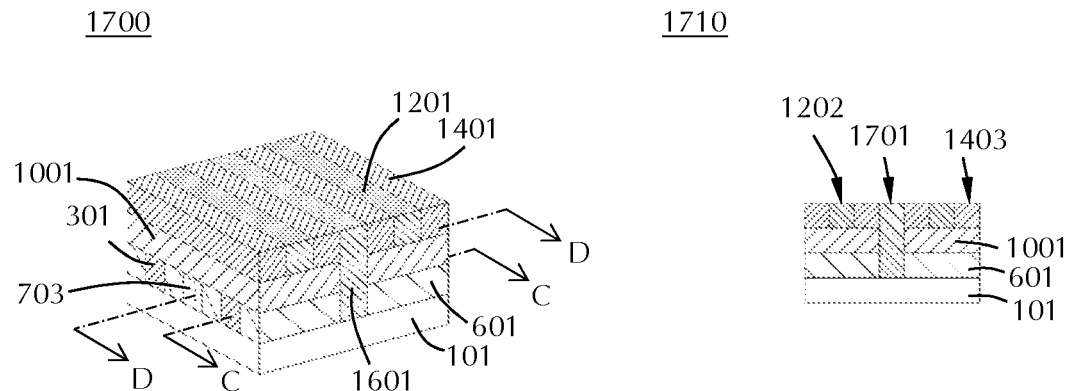
FIG. 17A is a view similar to FIG. 16A after an etchback process according to one embodiment.
Figure 17B:
FIG. 17B illustrates a front slice of the electronic device structure depicted in FIG. 17A.
Figure 17C:
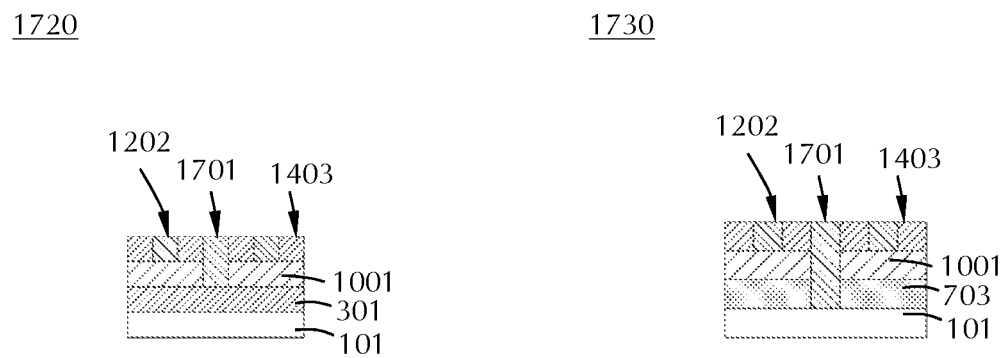
FIG. 17C illustrates a slice of the electronic device structure depicted in FIG. 17A taken in the y-z plane along line C-C.
Figure 17D:
FIG. 17D illustrates a slice of the electronic device structure depicted in FIG. 17A taken in the y-z plane along the line D-D.

In some embodiments, deposition of the spin-on material 1601 leaves the top surface 1202 of the third lines 1201 and the top surface 1403 of the fourth lines 1401 exposed. In embodiments in which an overburden 1602 is formed, the overburden is removed in an etch back process. FIG. 17A is a view 1700 similar to isometric view 1600 of FIG. 16A, after an etch back process according to one or more embodiment. FIG. 17B is a view 1710 showing the front of FIG. 17A. FIG. 17C is a view 1720 showing a slice taken in the y-z plane along the line C-C of FIG. 17A. FIG. 17D is a view 1730 showing a slice taken in the y-z plane along the line D-D of FIG. 17A.

The etch back process can be any suitable process. In some embodiments, the etch back process is a selective etch process that removes the spin-on material 1601 without affecting the third lines 1201 or fourth lines 1401. In some embodiments, the etch back process comprises an ashing process, as will be understood by the skilled artisan, leaving a top surface 1701 of the spin-on material 1601 level or slightly below the top surface 1202 of the third lines 1201 and top surface 1403 of the fourth lines 1401 exposed.

FIG. 18 is a view 1800 similar to isometric view 1700 of FIG. 17A, after a mandrel pull-out process according to one or more embodiment. FIG. 18B is a view 1810 showing the front of FIG. 18A. FIG. 18C is a view 1820 showing a slice taken in the y-z plane along the line C-C of FIG. 18A. FIG. 18D is a view 1830 showing a slice taken in the y-z plane along the line D-D of FIG. 18A.

The mandrel pull-out process selectively removes the third lines 1201 to expose the top surface 1102 of the oxide layer 1001 through opening 1801. The mandrel pull-out process of some embodiments is etch selective to the third lines 1201. In some embodiments, the third lines comprise silicon nitride. In some embodiments, the films remaining after pull-out comprise one or more of a boride (e.g., silicon boride), a spin-on material (e.g., spin-on-carbon) or an oxide (e.g., silicon oxide).

Figure 18A:
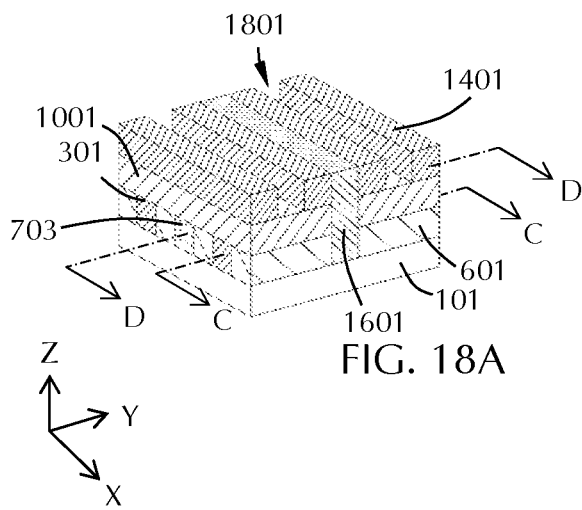
FIG. 18A is a view similar to FIG. 17A after a mandrel pull-out process according to one embodiment.
Figure 18B:
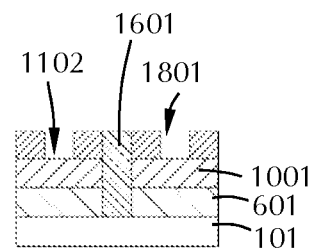
FIG. 18B illustrates a front slice of the electronic device structure depicted in FIG. 18A.
Figure 18C:
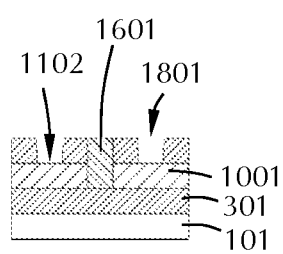
FIG. 18C illustrates a slice of the electronic device structure depicted in FIG. 18A taken in the y-z plane along line C-C.
Figure 18D:
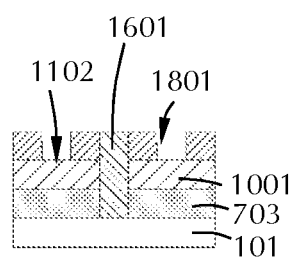
FIG. 18D illustrates a slice of the electronic device structure depicted in FIG. 18A taken in the y-z plane along the line D-D.

FIG. 19 is a view 1900 similar to isometric view 1800 of FIG. 18A, after an oxide etch process according to one or more embodiment. FIG. 19B is a view 1910 showing the front of FIG. 19A. FIG. 19C is a view 1920 showing a slice taken in the y-z plane along the line C-C of FIG. 19A. FIG. 19D is a view 1930 showing a slice taken in the y-z plane along the line D-D of FIG. 19A.

The oxide etch process removes the oxide layer 1001 through openings 1801 formed in the mandrel pull-out. Removal of the oxide layer 1001 exposes the top surface 603 of the second lines 601 (FIG. 19B), the top surface 302 of the first lines 301 (FIG. 19C) and the top surface 705 of the carbon material lines 703 (FIG. 19D).

The oxide removal can be performed by any suitable process known to the skilled artisan. In some embodiments, the oxide film is one or more of a silicon oxide or a low temperature oxide material. In some embodiments, the films remaining after the oxide etch (i.e., the selective films) comprise one or more of a boride (e.g., silicon boride), a spin-on material (e.g., spin-on-carbon), a nitride (e.g., silicon nitride) or a different low temperature oxide.

Figure 19A:
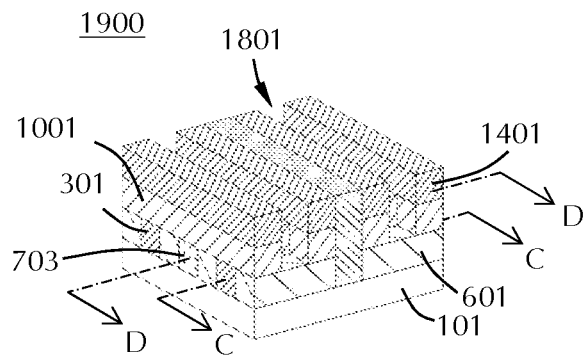
FIG. 19A is a view similar to FIG. 18A after an oxide etch process according to one embodiment.
Figure 19B:
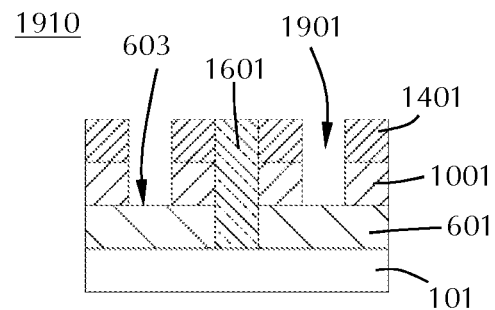
FIG. 19B illustrates a front slice of the electronic device structure depicted in FIG. 19A.
Figure 19C:
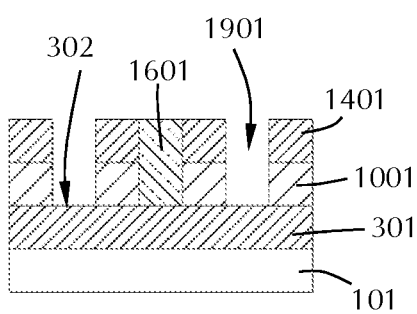
FIG. 19C illustrates a slice of the electronic device structure depicted in FIG. 19A taken in the y-z plane along line C-C.
Figure 19D:
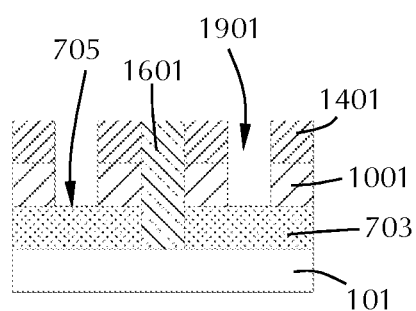
FIG. 19D illustrates a slice of the electronic device structure depicted in FIG. 19A taken in the y-z plane along the line D-D.

FIG. 20 is a view 2000 similar to isometric view 1900 of FIG. 19A, after removal of the fourth lines 1401 according to one or more embodiment. FIG. 20B is a view 2010 showing the front of FIG. 20A. FIG. 20C is a view 2020 showing a slice taken in the y-z plane along the line C-C of FIG. 20A. FIG. 20D is a view 2030 showing a slice taken in the y-z plane along the line D-D of FIG. 20A.

Removal of the fourth lines 1401 exposes the top surface 1202 of the third lines 1201. In some embodiments, the fourth lines 1401 are removed by a chemical-mechanical planarization process so that the top surface 1701 of the spin-on material 1601 remains level with the top surface 1202 of the third lines 1201. In some embodiments, as shown in FIG. 20C, the top surface 105 of the substrate 101 is exposed through the opening 2001.

FIG. 21 is a view 2100 similar to isometric view 2000 of FIG. 20A, after removal of the spin-on material 1601 according to one or more embodiment. FIG. 21B is a view 2110 showing the front of FIG. 21A. FIG. 21C is a view 2120 showing a slice taken in the y-z plane along the line C-C of FIG. 21A. FIG. 21D is a view 2130 showing a slice taken in the y-z plane along the line D-D of FIG. 21A.

Removal of the spin-on material 1601 exposes the surface 105 of the substrate 101 through opening 2101. As can be seen in the slice views, the surface 105 of the substrate 101 can be exposed through alternating openings. The surface 105 of the substrate 101 is exposed through opening 2001 in first lines 301 and through opening 2101 in carbon material lines 703 and second lines 601.

The removal process can be any suitable process known to the skilled artisan. In some embodiments, the removal process comprises an ashing process that removes the spin-on material 1601 without affecting the other materials.

Figure 21A:
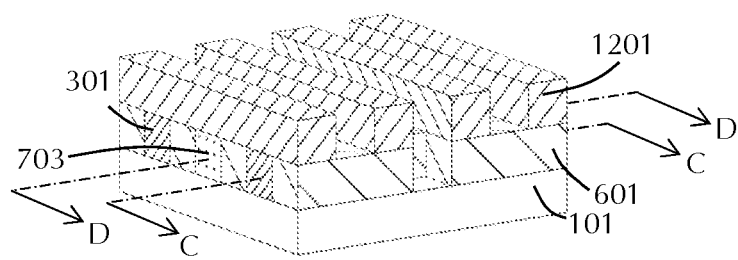
FIG. 21A is a view similar to FIG. 20A after an ashing process according to one embodiment.
Figure 21B:
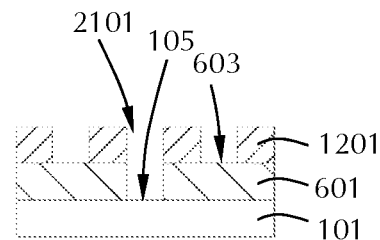
FIG. 21B illustrates a front slice of the electronic device structure depicted in FIG. 21A.
Figure 21C:
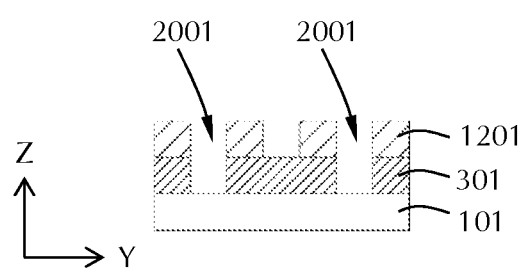
FIG. 21C illustrates a slice of the electronic device structure depicted in FIG. 21A taken in the y-z plane along line C-C.
Figure 21D:
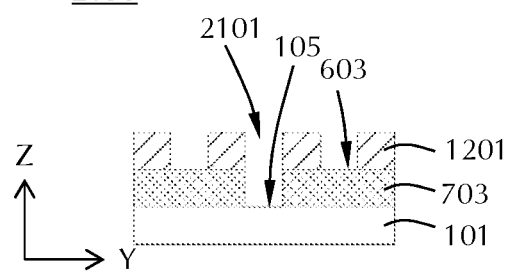
FIG. 21D illustrates a slice of the electronic device structure depicted in FIG. 21A taken in the y-z plane along the line D-D.

FIG. 22 is a view 2200 similar to isometric view 2100 of FIG. 21A, after removal of the oxide layer according to one or more embodiment. FIG. 22B is a view 2210 showing the front of FIG. 22A. FIG. 22C is a view 2220 showing a slice taken in the y-z plane along the line C-C of FIG. 22A. FIG. 22D is a view 2230 showing a slice taken in the y-z plane along the line D-D of FIG. 22A.

The oxide layer 1001 can be removed by any suitable technique known to the skilled artisan. In some embodiments, the oxide layer 1001 is removed by a CMP process. In some embodiments, the oxide layer 1001 is removed by a selective etch process that is selective for the oxide layer 1001 relative to one or more of a boride material, spin-on material or nitride material.

Removal of the oxide layer 1001 can also remove the second lines 601 at the same time. In some embodiments, the second lines 601 are removed in a separate process than the removal of the oxide layer 1001. The removal of the oxide layer 1001 and second lines 601 provides a substrate 101 with a patterned first line 2201 and a patterned carbon material line 2202.

Figure 23:
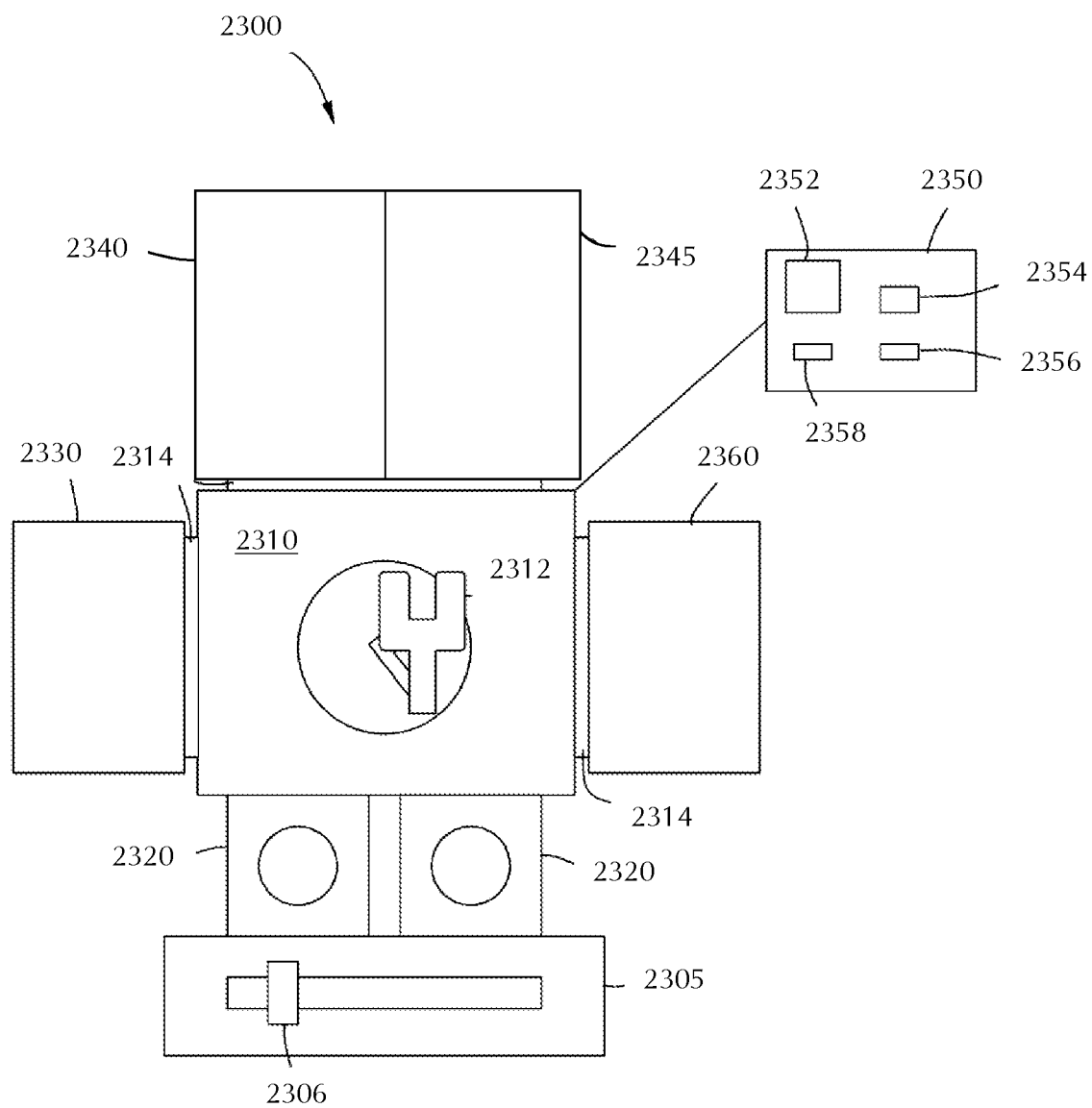
FIG. 23 illustrates a schematic representation of a processing tool for use with one or more embodiment of the disclosure.

With reference to FIG. 23, additional embodiments of the disclosure are directed to processing tools 2300 for executing the methods described herein. FIG. 23 illustrates a system 2300 that can be used to process a substrate according to one or more embodiment of the disclosure. The system 2300 can be referred to as a cluster tool. The system 2300 includes a central transfer station 2310 with a robot 2312 therein. The robot 2312 is illustrated as a single blade robot; however, those skilled in the art will recognize that other robot 2312 configurations are within the scope of the disclosure. The robot 2312 is configured to move one or more substrate between chambers connected to the central transfer station 2310.

At least one pre-clean/buffer chamber 2320 is connected to the central transfer station 2310. The pre-clean/buffer chamber 2320 can include one or more of a heater, a radical source or plasma source. The pre-clean/buffer chamber 2320 can be used as a holding area for an individual semiconductor substrate or for a cassette of wafers for processing. The pre-clean/buffer chamber 2320 can perform pre-cleaning processes or can pre-heat the substrate for processing or can simply be a staging area for the process sequence. In some embodiments, there are two pre-clean/buffer chambers 2320 connected to the central transfer station 2310.

In the embodiment shown in FIG. 23, the pre-clean chambers 2320 can act as pass through chambers between the factory interface 2305 and the central transfer station 2310. The factory interface 2305 can include one or more robot 2306 to move substrate from a cassette to the pre-clean/buffer chamber 2320. The robot 2312 can then move the substrate from the pre-clean/buffer chamber 2320 to other chambers within the system 2300.

A first processing chamber 2330 can be connected to the central transfer station 2310. The first processing chamber 2330 can be configured as an etching chamber and may be in fluid communication with one or more reactive gas sources to provide one or more flows of reactive gases to the first processing chamber 2330. The substrate can be moved to and from the processing chamber 2330 by the robot 2312 passing through isolation valve 2314.

Processing chamber 2340 can also be connected to the central transfer station 2310. In some embodiments, processing chamber 2340 comprises a deposition chamber and is fluid communication with one or more reactive gas sources to provide flows of reactive gas to the processing chamber 2340 to perform one or more deposition processes. The substrate can be moved to and from the deposition chamber 2340 by robot 2312 passing through isolation valve 2314. The number and type of depositions chambers 2340 can vary depending on the particular process being performed. In some embodiments, the deposition chambers are selected from one or more of atomic layer deposition chambers, chemical vapor deposition chambers, epitaxial growth chambers or physical vapor deposition chambers.

Processing chamber 2345 can also be connected to the central transfer station 2310. In some embodiments, the processing chamber 2345 is the same type of processing chamber 2340 configured to perform the same process as processing chamber 2340. This arrangement might be useful where the process occurring in processing chamber 2340 takes much longer than the process in processing chamber 2330.

In some embodiments, processing chamber 2360 is connected to the central transfer station 2310 and is configured to act as a selective etch processing chamber. The processing chamber 2360 can be configured to perform one or more different selective etching processes.

In some embodiments, each of the processing chambers 2330, 2340, 2345 and 2360 are configured to perform different portions of the processing method. The skilled artisan will recognize that the number and arrangement of individual processing chamber on the tool can be varied and that the embodiment illustrated in FIG. 23 is merely representative of one possible configuration.

At least one controller 2350 is coupled to one or more of the central transfer station 2310, the pre-clean/buffer chamber 2320, processing chambers 2330, 2340, 2345, or 2360. In some embodiments, there are more than one controller 2350 connected to the individual chambers or stations and a primary control processor is coupled to each of the separate processors to control the system 2300. The controller 2350 may be one of any form of general-purpose computer processor, microcontroller, microprocessor, etc., that can be used in an industrial setting for controlling various chambers and sub-processors.

The at least one controller 2350 can have a processor 2352, a memory 2354 coupled to the processor 2352, input/output devices 2356 coupled to the processor 2352, and support circuits 2358 to communication between the different electronic components. The memory 2354 can include one or more of transitory memory (e.g., random access memory) and non-transitory memory (e.g., storage).

The memory 2354, or computer-readable medium, of the processor may be one or more of readily available memory such as random access memory (RAM), read-only memory (ROM), floppy disk, hard disk, or any other form of digital storage, local or remote. The memory 2354 can retain an instruction set that is operable by the processor 2352 to control parameters and components of the system 2300. The support circuits 2358 are coupled to the processor 2352 for supporting the processor in a conventional manner. Circuits may include, for example, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 2350 has one or more configurations to execute individual processes or sub-processes to perform the method. The controller 2350 can be connected to and configured to operate intermediate components to perform the functions of the methods. For example, the controller 2350 can be connected to and configured to control one or more of gas valves, actuators, motors, slit valves, vacuum control, etc.

The controller 2350 of some embodiments has one or more configurations selected from: a configuration to move a substrate on the robot between the plurality of processing chambers; a configuration to perform mandrel pull-out process; a configuration to perform a conformal deposition process; a configuration to perform an isotropic etch process; a configuration to perform an anisotropic etch process; a configuration to perform a gapfill process; a configuration to perform a spin-on deposition process; a configuration to perform an etchback process; a configuration to perform an oxide layer deposition process; a configuration to perform a nitride layer deposition process; a configuration to perform a spacer deposition process; a configuration to perform a spacer etch process; a configuration to perform a first cut process; a configuration to perform a mandrel pull-out process for the third lines; a configuration to perform an oxide etch process; a configuration to perform a spin-on material etch process; a configuration to perform a boride film etch process; a configuration to perform an ashing process and/or a configuration to perform an oxide removal process.

In the foregoing specification, embodiments of the disclosure have been described with reference to specific exemplary embodiments thereof. It will be evident that various modifications may be made thereto without departing from the broader spirit and scope of the embodiments of the disclosure as set forth in the following claims. The specification and drawings are, accordingly, to be regarded in an illustrative sense rather than a restrictive sense.

What is claimed is:

1. A method of forming an electronic device, the method comprising:
    forming a carbon gapfill material between a plurality of first lines and a plurality of second lines, the plurality of first lines comprising a first spacer material extending along a first direction, the plurality of second lines comprising a second spacer material extending along the first direction, the second lines arranged on either side of the plurality of first lines with the carbon gapfill material between the first lines and second lines;
    forming an oxide layer on a top surface of the first spacer material, the second spacer material and the carbon gapfill material;
    forming a plurality of spaced third lines of a third spacer material in a second direction different from the first direction so that the third spacer lines cross the first spacer lines and the carbon gapfill material; and
    forming lines of fourth spacer material on either side of the spaced third material lines leaving a trench between adjacent fourth spacer material lines exposing a top surface of the oxide layer, the trench extending along the second direction.

2. The method of claim 1, wherein forming the carbon gapfill material comprises depositing a flowable film to fill the trench with carbon gapfill material.

3. The method of claim 1, wherein forming the carbon gapfill material comprises a conformal gapfill process to fill a trench between the first spacer material and second spacer material with the carbon gapfill material and form a carbon line extending along the first direction and an overburden carbon material with an opening aligned with the carbon gapfill material in the filled trench.

4. The method of claim 3, further comprising filling the opening in the overburden carbon material with a spin-on-carbon (SOC) layer.

5. The method of claim 4, further comprising removing the SOC layer and the overburden carbon material to expose a top surface of the first spacer material, the second spacer material and the carbon gapfill material.

6. The method of claim 5, wherein the carbon material comprises a diamond-like carbon.

7. The method of claim 6, wherein the diamond-like carbon has one or more of a stress less than or equal to −500 MPa, a density greater than or equal to 1.8 g/cc or modulus greater than or equal to 150 GPa.

8. The method of claim 6, wherein the carbon material is formed by a chemical vapor deposition or plasma-enhanced chemical vapor deposition process using a gapfill precursor.

9. The method of claim 8, wherein the gapfill precursor comprises a hydrocarbon.

10. The method of claim 9, wherein the hydrocarbon is selected from a group consisting of: $C_2H_2$, $C_3H_6$, $CH_4$, $C_4H_8$, 1,3-dimethyladamantane, bicyclo[2.2.1]hepta-2,5-diene (2,5-Norbornadiene), adamantine ($C_{10}H_{16}$), norbornene ($C_7H_{10}$), or combinations thereof.

* * * * *